United States Patent
Phillips et al.

(10) Patent No.: US 6,913,808 B2
(45) Date of Patent: Jul. 5, 2005

(54) BARRIER FILM HAVING HIGH COLORLESS TRANSPARENCY AND METHOD

(75) Inventors: Roger W. Phillips, Santa Rosa, CA (US); Lauren R. Wendt, Santa Rosa, CA (US); Myra Tan-Johnson, Petaluma, CA (US); David W. Todd, Glenville, NY (US); Charles Thomas Markantes, Santa Rosa, CA (US)

(73) Assignee: JDS Uniphase Corporation, San Jose, CA (US)

( * ) Notice: Subject to any disclaimer, the term of this patent is extended or adjusted under 35 U.S.C. 154(b) by 0 days.

(21) Appl. No.: 10/457,918

(22) Filed: Jun. 9, 2003

(65) Prior Publication Data

US 2003/0211261 A1 Nov. 13, 2003

Related U.S. Application Data

(60) Division of application No. 08/062,736, filed on May 14, 1993, now Pat. No. 6,576,294, which is a continuation-in-part of application No. 07/785,870, filed on Nov. 1, 1991, now abandoned, which is a continuation of application No. 07/535,183, filed on Jun. 8, 1990, now abandoned, which is a continuation-in-part of application No. 07/426,342, filed on Oct. 24, 1989, now abandoned.

(51) Int. Cl.$^7$ .............................................. B29D 22/00
(52) U.S. Cl. ..................... 428/35.7; 206/484; 428/35.9; 428/336; 428/701
(58) Field of Search ............................... 428/35.7, 35.9, 428/336, 701

(56) References Cited

U.S. PATENT DOCUMENTS 3,442,686 A * 5/1969 Jones ........................ 428/336
4,702,963 A * 10/1987 Phillips et al. ............. 428/35.3
4,741,957 A * 5/1988 Park .......................... 428/412

FOREIGN PATENT DOCUMENTS

GB 2210826 * 6/1989

* cited by examiner

Primary Examiner—Archene Turner
(74) Attorney, Agent, or Firm—Allen, Dyer, Doppelt, Milbrath & Gilchrist, P.A.

(57) ABSTRACT

Barrier film with a high colorless transparency comprising a flexible plastic substrate. A barrier layer is formed on the surface and has a thickness ranging from approximately 50 to less than 200 Angstroms and is formed of a material selected from the group of aluminum oxide, tin oxide and yttrium oxide. An additional barrier layer formed of silicon dioxide may also be formed on the barrier layer.

9 Claims, 5 Drawing Sheets

BARRIER FILM HAVING HIGH COLORLESS TRANSPARENCY AND METHOD

This application is a divisional application of U.S. utility patent application Ser. No. 08/062,736 filed May 14, 1993, now U.S. Pat. No. 6,576,294, which is a continuation-in-part of U.S. patent application Ser. No. 07/785,870 filed Nov. 1, 1991, now abandoned, which is a continuation of U.S. patent application Ser. No. 07/535,183 filed Jun. 8, 1990, now abandoned, which is a continuation-in-part of U.S. patent application Ser. No. 07/426,342 filed Oct. 24, 1989, now abandoned, the entire contents of each of which are incorporated herein by this reference.

This invention relates to a barrier film having high colorless transparency and a method for forming the same.

Barrier films have heretofore been provided. Typical coatings are of the type disclosed in British patent specification 1,086,482. It is disclosed therein that the preferred inorganic coatings are oxides of silicon and aluminum which can be deposited as transparent flexible coatings in a glassy state. Silicon monoxide or silicon dioxide are mentioned as starting materials and aluminum oxide for the aluminum coatings. This aluminum oxide is identified in Table V as being Norton Alundum #4186. This is not a pure aluminum oxide but a mixture of aluminum oxide and silicon dioxide ($Al_2O_3$ in a $SiO_2$ binder). Zirconium oxide is also mentioned as a starting material. However, this material is not particularly suited for evaporation techniques because of its high melting temperature. Silver chloride which is also identified as a starting material is undesirable because it becomes hazy when deposited as a coating material. With respect to all of the starting materials mentioned, they are deposited as a single layer. In coating operations, the roll speed is very slow at the rate of 3 inches per minute. The single layer is also deposited to a thickness, as for example, 6000 Angstroms which is very thick. It is pointed out that the minimum thickness is 0.02 microns (200 Å). Below this thickness the inorganic barrier layer is ineffectual. The tables in the British patent specification 1,086,482 disclose the barrier properties with respect to oxygen and helium, but do not address water permeability. In addition, in U.S. Pat. No. 4,702,963 there is disclosed a barrier film which is made from silicon monoxide or a suboxide of $SiO_2$. Although this barrier film has good barrier properties, it has the undesirable feature that it has an amber color. This amber color is objectionable in many packaging applications because it obscures the true color of the product within the package. It has been found that when silicon dioxide is deposited directly on a film by electron beam evaporation no additional barrier properties are provided by the silicon dioxide. There is therefore a need for a new and improved barrier film which has a colorless transparency. In addition, there is a need to replace existing aluminized polyester and co-extruded polymeric films. Also, in view of solid waste disposal problems, there is a need to limit the use of non-recyclable plastic films. There is also a need to reduce the total volume of plastic waste which is non-recyclable by reducing the thickness and the number of plastic layers and by recycling the plastic film. Co-extruded plastic film structures are not easily recycled because of the complexity of the chemical structures in the co-extrudants. There is also a need to reduce the use of PVC and PVDC as barrier materials in film in order to eliminate migration of un-reacted monomers reaching food contents packaged within such barrier films.

In general, it is an object of the present invention to provide a barrier film having high colorless transparency and a method for making the same.

Another object of the invention is to provide a barrier film of the above character having water white high colorless transparency.

Another object of the invention is to provide a barrier film of the above character which has an overall reduced thickness.

Another object of the invention is to provide a barrier film of the above character which can run efficiently in conventional cigarette packaging machines.

Another object of the invention is to provide a barrier film of the above character which has a thickness in the range of 70–80 gauge.

Another object of the invention is to provide a barrier film of the above character which has decreased yield losses.

Another object of the invention is to provide a barrier film of the above character which will not curl.

Another object of the invention is to provide a barrier film of the above character which is a monolithic product that can be heat sealed onto itself.

Another object of the invention is to provide a barrier film of the above character which has low friction.

Another object of the invention is to provide a barrier film of the above character which is particularly suitable for tobacco products such as cigarettes.

Another object of the invention is to provide a barrier film of the above character which can be produced at a reduced cost.

Another object of the invention is to provide a barrier film of the above character which will tear in a straight line.

Another object of the invention is to provide a barrier film of the above character which does not require the use of aluminum.

Another object of the invention is to provide a barrier film of the above character which does not require the use of co-extruded polymeric films.

Another object of the invention is to provide a barrier film of the above character which reduces the total volume of plastic required.

Another object of the invention is to provide a barrier film of the above character which reduces the difficulty of recycling.

Another object of the invention is to provide a barrier film of the above character which can be utilized for food packaging which can be used in microwave ovens.

Another object of the invention is to provide a barrier film of the above character which uses a non-metal which can be utilized for packaging food which can be used in a microwave unit and still be transparent with a long shelf life.

Another object of the invention is to provide a barrier film of the above character in which PVDC need not be utilized as barrier materials.

Another object of the invention is to provide a barrier film of the above character which can maintain a given moisture content for contents packaged in the barrier film.

Another object of the invention is to provide a barrier film and method in which the barrier film can be produced in a roll coater at high production speeds.

Another object of the invention is to provide a barrier film of the above character which is provided with a heat seal layer so that it can be readily utilized as a self-sealing packaging material.

Another objection of the invention is to provide a barrier film of the above character which serves as an overwrap packaging film that will increase shelf life of moisture and oxygen sensitive products.

Additional objects and features of the invention will appear from the following description in which the preferred embodiments are set forth in detail in conjunction with the accompanying drawings.

In general, the barrier film having a high colorless transparency is comprised of a substrate formed essentially of a plastic having first and second surfaces. A barrier layer is formed on the first surface and has a thickness ranging from approximately 50 to 300 Angstroms and is formed from a material selected from the group of aluminum oxide ($Al_2O_3$), tin oxide ($SnO_2$) and yttrium oxide ($Y_2O_3$). An additional layer of silicon dioxide may be formed on the barrier layer and having a thickness ranging from 100 to 1000 Angstroms.

Figure 1:
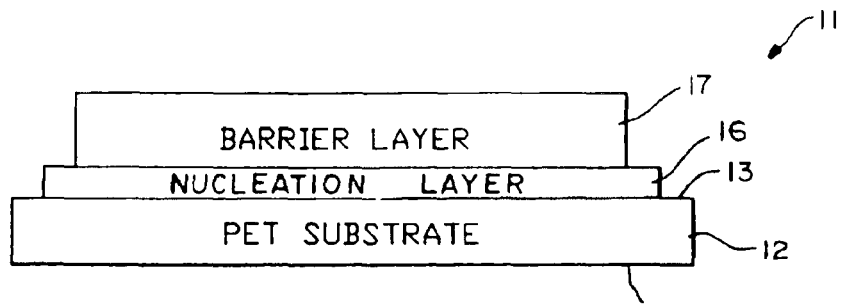
FIG. 1 is a cross sectional view of a barrier film incorporating the present invention in which a barrier layer is provided on one side of the flexible plastic substrate.

More in particular, as shown in FIG. 1, the barrier film 11 is comprised of a substrate 12 formed of a suitable flexible plastic as, for example, PET which is a polyester having a thickness ranging from approximately 48 gauge which is approximately ½ mil to a thickness of 4 mils. The substrate is provided with first and second surfaces 13 and 14. A nucleation layer 16 of a thickness ranging from approximately 50 to 100 Angstroms is deposited on the surface 13. The nucleation layer is formed of a single material selected from pure aluminum oxide ($Al_2O_3$), pure tin oxide ($SnO_2$), pure yttrium oxide ($Y_2O_3$), with pure meaning 99.0% purity or better. Typically the nucleation layer is formed by electron beam evaporation of material onto the surface 13. If desired, the material also can be deposited by sputtering. Electron beam evaporation has been found to be desirable because it is possible to evaporate material rapidly and over a wide area so that the material can be applied cost effectively on rapidly moving sheet material in a roll coater. By way of example, the material forming the nucleation layer can be evaporated over a width of at least two meters and with a rapidly moving film.

A barrier layer 17 formed of silicon dioxide ($SiO_2$) is then deposited upon the nucleation layer 16. The starting material is silicon dioxide which is a clear transparent material. It is deposited by electron beam evaporation to a thickness ranging from 100 to 1000 Angstroms. Alternatively, if desired, the silicon dioxide can then be deposited by reactive sputtering. As hereinafter pointed out that MS-65 produced by Flex Products, Inc. of Santa Rosa, Calif. can be substituted for the silicon dioxide.

The coating applied to the surface 13 which is comprised of the nucleation layer 16 and the barrier layer 17 is deposited in a two-step process in which the nucleation layer 16 is deposited first followed by the silicon dioxide barrier layer 17. This can be readily accomplished on a roll coater by first depositing the nucleation layer 16 followed by the silicon dioxide layer 17 at subsequent spaced apart locations in the roll coater. Alternatively, the two layers, the nucleation layer and the barrier layer 17 can be deposited in two separate passes of the film in the roll coater.

Figure 2:
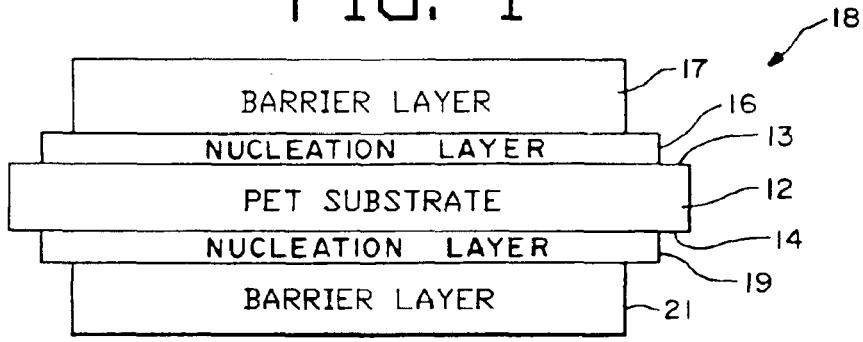
FIG. 2 is a cross sectional view of a barrier film incorporating the present invention in which a barrier layer is provided on both sides of the flexible plastic substrate.

If still further improved barrier properties are desired for the film, the same type of coating which is placed on the one side or surface 13 of the flexible plastic substrate 12 can also be placed on the other side or surface 14 of the substrate 12. Thus, there has been provided in FIG. 2, a barrier film 18 which has the nucleation layer 16 and the barrier layer 17 on the surface 13 and an additional nucleation layer 19 on the surface 14 followed by a silicon dioxide barrier layer 21. The two layers 19 and 21 can be formed of the same materials and can have the same characteristics as the layers 16 and 17 on the surface 13 of the substrate 12.

Figure 3:
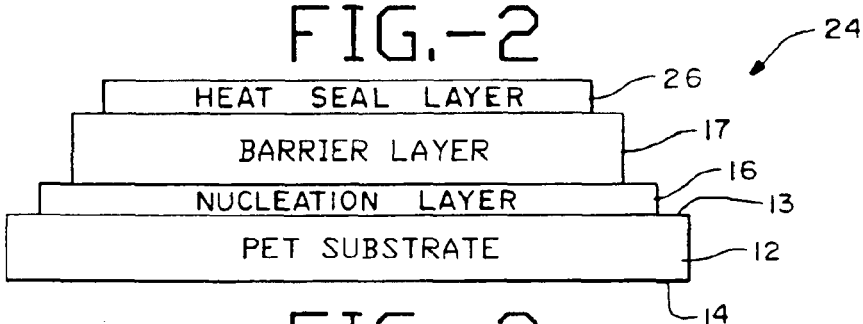
FIG. 3 is a cross sectional view similar to the one shown in FIG. 1 with a heat seal layer to facilitate use of the barrier film as a packaging material.

When the barrier film of the present invention is to be utilized as a packaging material, a barrier film 24 of the type shown in FIG. 3 can be utilized. The embodiment of the barrier film 11 shown in FIG. 1 is provided with a heat seal layer 26 formed of a suitable heat sealing material well known to those skilled in the art. A suitable heat sealing material would be cross-linked ethylene acrylic acid or high molecular weight ethylene acetate polymers or urethane polymers. Typically this could be accomplished by taking the roll coated polyester which has been coated with the nucleation layer 16 and the barrier layer and depositing the heat seal layer using a gravure coater or slot coater or other appropriate coater. The heat sealing material typically would be of a material in which heat sealing could be accomplished at 100 to 150° C. with a few seconds of contact.

Figure 4:
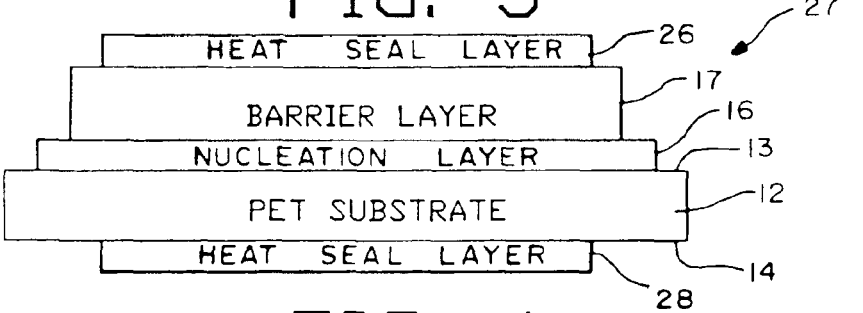
FIG. 4 is a cross sectional view similar to FIG. 2 but showing the use of heat seal layers on both sides of the substrate to facilitate use of the barrier film in packaging materials.

When heat seal capabilities are desired on both sides of a barrier film, a barrier film 27 such as that shown in FIG. 4 can be utilized in which another heat seal layer 28 is provided on the surface 14. This heat seal layer 28 can be formed of the same material as the heat seal layer 26. The heat seal layers can have a typical thickness ranging from 0.1–1 mil.

Table 1 as set forth below which sets forth water vapor barrier film data for barrier films, on polyester terephthalate (PET) which has been collected in making barrier films in accordance with the present invention.

TABLE 1

WATER VAPOR BARRIER FILM DATA

| Design Thickness | | Substrate | WVTR g/100 sq.in./day |
|---|---|---|---|
| BOX COATER | | | |
| UNCOATED | | 1 mil PET | 1.2–1.3 |
| UNCOATED | | 2 mil PET | .56–.63 |
| 2000Å SiO$_2$ | | 2 mil PET | 0.51 |
| 1000Å SiO$_2$ | | 2 mil PET | 0.67 |
| 500Å SiO$_2$ | | 2 mil PET | 0.67 |
| 100Å Al$_2$O$_3$/500Å | SiO$_2$ | 1 mil PET | 0.072 |
| 50Å Al$_2$O$_3$/500Å | SiO$_2$ | 1 mil PET | 0.063 |
| 25Å Al$_2$O$_3$/500Å | SiO$_2$ | 1 mil PET | 0.419 |
| 10Å Al$_2$O$_3$/500Å | SiO$_2$ | 1 mil PET | 1.39 |
| 100Å Al$_2$O$_3$/500Å | SiO$_2$ | 2 mil PET | 0.072 |
| 50Å Al$_2$O$_3$/500Å | SiO$_2$ | 2 mil PET | 0.064 |
| 25Å Al$_2$O$_3$/500Å | SiO$_2$ | 2 mil PET | 0.159 |
| 10Å Al$_2$O$_3$/500Å | SiO$_2$ | 2 mil PET | 0.68 |
| 100Å Al$_2$O$_3$/250Å | SiO$_2$ | 1 mil PET | 0.111 |
| 50Å Al$_2$O$_3$/250Å | SiO$_2$ | 1 mil PET | 0.122 |
| 25Å Al$_2$O$_3$/250Å | SiO$_2$ | 1 mil PET | 0.14 |
| 10Å Al$_2$O$_3$/250Å | SiO$_2$ | 1 mil PET | 1.45 |
| 100Å Al$_2$O$_3$/250Å | SiO$_2$ | 2 mil PET | 0.104 |
| 50Å Al$_2$O$_3$/250Å | SiO$_2$ | 2 mil PET | 0.092 |
| 25Å Al$_2$O$_3$/250Å | SiO$_2$ | 2 mil PET | 0.629 |
| 10Å Al$_2$O$_3$/250Å | SiO$_2$ | 2 mil PET | 0.69 |
| 100Å SnO$_2$/500Å | SiO$_2$ | 1 mil PET | 0.058 |
| 50Å SnO$_2$/500Å | SiO$_2$ | 1 mil PET | 0.073 |
| 25Å SnO$_2$/500Å | SiO$_2$ | 1 mil PET | 0.589 |
| 100Å SnO$_2$/500Å | SiO$_2$ | 2 mil PET | 0.073 |
| 50Å SnO$_2$/500Å | SiO$_2$ | 2 mil PET | 0.079 |
| 25Å SnO$_2$/500Å | SiO$_2$ | 2 mil PET | 0.364 |
| 100Å Y$_2$O$_3$/500Å | SiO$_2$ | 2 mil PET | 0.0468 |
| 50Å Y$_2$O$_3$/500Å | SiO$_2$ | 2 mil PET | 0.0747 |
| 25Å Y$_2$O$_3$/500Å | SiO$_2$ | 2 mil PET | 0.26 |
| 100Å Y$_2$O$_3$/500Å | SiO$_2$ | 1 mil PET | 0.035 |
| 50Å Y$_2$O$_3$/500Å | SiO$_2$ | 1 mil PET | 0.0917 |
| 25Å Y$_2$O$_3$/500Å | SiO$_2$ | 1 mil PET | 0.542 |
| ROLL COATER | | | |
| 75Å Al$_2$O$_3$/250Å | SiO$_2$ | 1 mil PET | 0.14 |
| 75Å Al$_2$O$_3$/375Å | SiO$_2$ | 1 mil PET | 0.13 |
| 75Å Al$_2$O$_3$/500Å | SiO$_2$ | 1 mil PET | 0.14 |

It can be seen that the data in the above-identified table is gathered from two sources; a box coater and a roll coater. The water vapor transmission rate is set forth in grams per 100 square inches per day of barrier film. The flexible plastic substrate utilized had a thickness of 1 and 2 mils as shown. The table shows when the substrate was uncoated it had a water transmission rate appears to be directly related to the thickness of the film. Coating of the substrate with silicon dioxide alone at various thicknesses did very little, if any, to increase the barrier properties of the film. However, the addition of a nucleation layer formed of one of the materials previously identified gave dramatic improvements in the reduction in water vapor transmission rate as shown in the above table by a factor of approximately 20. It also shows that the water vapor transmission rate was not changed significantly by increasing the thickness of the substrate.

Figure 6:
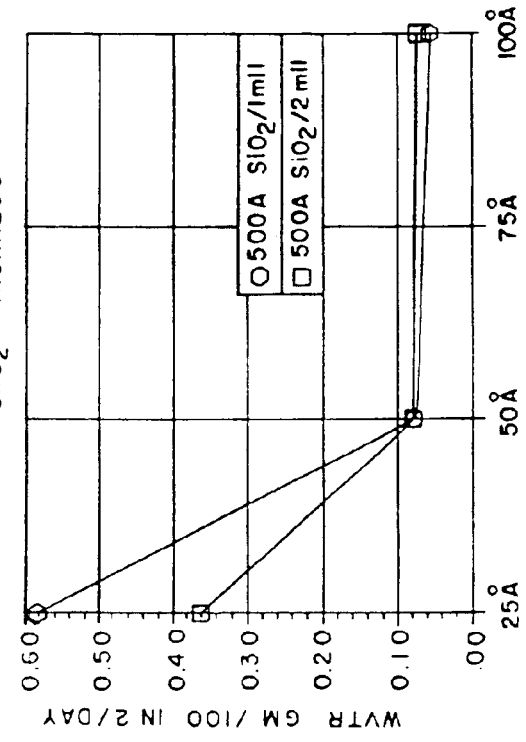
FIG. 6 is a graph showing water vapor transmission data using aluminum oxide and silicon dioxide layers.
Figure 7:
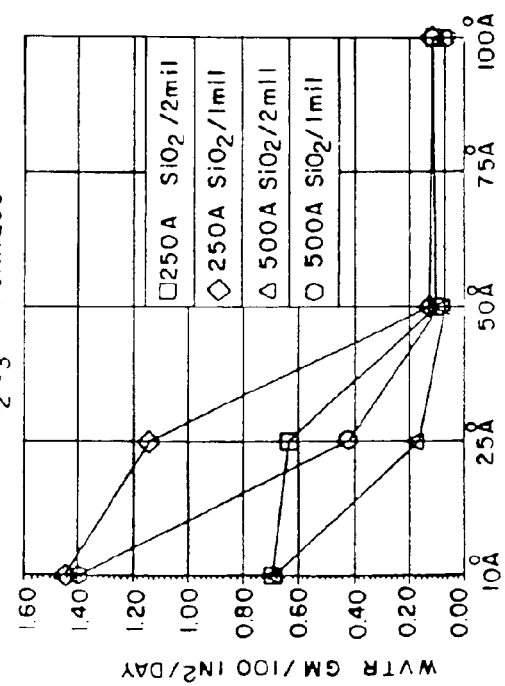
FIG. 7 is a graph showing water vapor transmission data for tin oxide and silicon dioxide layers.
Figure 8:
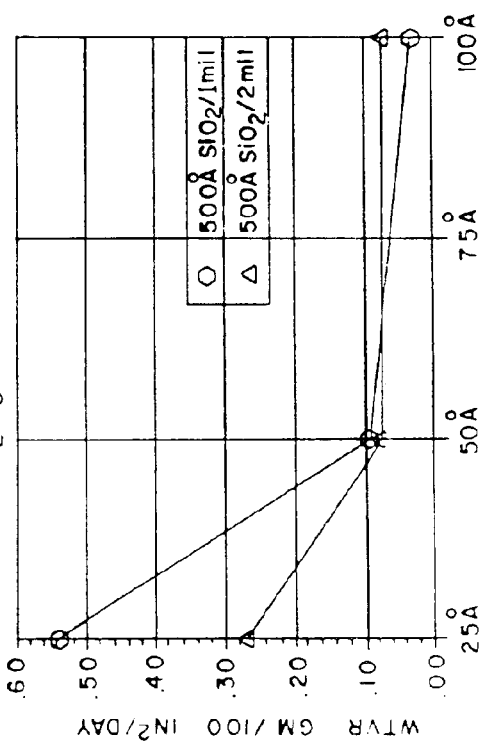
FIG. 8 is a graph showing water vapor transmission data using yttrium oxide and silicon dioxide layers.

Certain other data shown in Table 1 has been plotted in the graphs shown in FIGS. 6, 7 and 8. The data for the aluminum oxide nucleation layer is plotted in FIG. 6, whereas the data for the tin oxide nucleation layer is plotted in FIG. 7. Four plots are shown in FIG. 6. From FIG. 6, it can be seen that three variables are being plotted, the substrate thickness, the Angstroms of aluminum oxide and the thickness of the silicon dioxide barrier layer. The graph shows that the thicker layers of silicon dioxide are more effective as a barrier to water vapor transmission than the thinner layer.

In examining the chart in FIG. 6, it also can be seen that when the nucleation layer of aluminum oxide becomes less than 50 Angstroms, the water vapor transmission rate rises very sharply so that the combination of the aluminum oxide nucleation layer and the silicon dioxide layer is relatively ineffective as a water vapor barrier. Thus it can be seen that the basic parameter which controls the large variation in water vapor transmission rate is the thickness of the aluminum oxide nucleation layer. There is a minor change due to the thickness of the silicon dioxide layer.

In comparing the results in box coaters with roll coaters as shown in Table 1, it can be seen that the results obtained in the roll coater show that the water vapor transmission rate is not quite as low in the roll coater as in the box coater. This is believed to be due to the fact that there are more variables in a roll coater making it more difficult to achieve the same results as in a box coater. However, it can be seen that the results are substantially equivalent and that the great advantage in using the roll coater in producing barrier films at high capacity can make the use of roll coaters for forming such barrier films very desirable because of the cost effectiveness of the roll coaters.

From examining the data which is shown in Table 1, it can be seen that improvements by a factor of 20 can be obtained in the water vapor transmission rate with the use of the nucleation layer and the silicon dioxide layer of the type hereinbefore described. In addition, it can be seen that the water vapor transmission rate is relatively independent of the thickness of the substrate indicating that the barrier qualities are principally provided by the coating on the substrate.

Of the materials utilized for a nucleation layer, the aluminum oxide, the tin oxide and the yttrium oxide, all provide barrier films which are water white transparent. When tin oxide is utilized as a nucleation layer with silicon dioxide as shown in the graph in FIG. 7, results similar to that shown in FIG. 6 are obtained. Again, it can be seen that when the nucleation layer has a thickness of less than 50 Angstroms, the water vapor transmission rate rises sharply so that it is apparent that whenever the nucleation layer is less than 50 Angstroms in thickness, the water vapor barrier capabilities rapidly diminish. It also can be seen that the thickness of the substrate has very little effect on the water vapor transmission characteristics, although, it is noted that a slightly improved vapor transmission rate is achieved with the thicker substrate.

When yttrium oxide is used as the nucleation layer with silicon dioxide as shown in the graph in FIG. 8 results similar to that obtained in FIGS. 6 and 7 are obtained. These graphs in FIGS. 6, 7 and 8 show that with all four designs with 1 and 2 mil PET, the nucleation layer has an effect at 50 Angstroms and above in thickness.

It has been noted that sometimes when the heat seal coatings are applied, the WVTR's are reduced even further. This effect is attributed to the heat seal coating filling up microscopic pores or pin holes in the oxide coating. This is demonstrated by Table 2 set forth below which gives water vapor transmission rates of barrier films of the present invention.

TABLE 2

WATER VAPOR TRANSMISSION RATES (WVTR)
WVTR of Heat Sealed 1 mil ICI 393/Al$_2$O$_3$ 75 Å/SiO$_2$ 250Å*

| | |
|---|---|
| Oxide Barrier | 0.33 ± 0.026 |
| Heat Seal/ Oxide Barrier | 0.135 ± 0.034 |

*Heat seal thickness = 0.15 mil

An oxygen permeation test on the 1 mil of roll coated material is set forth below in Table 3:

TABLE 3

OXYGEN TRANSMISSION

| Design Thickness | | | $O_2$ TR |
|---|---|---|---|
| 75Å | $Al_2O_3$ 500Å | $SiO_2$ | 0.15 cc/100 sq.in./day |
| 100Å | $Y_2O_3$ 500Å | $SiO_2$ | 0.0645 cc/100 sq.in./day |
| | uncoated substrate | | 3–4 cc/100 sq.in./day |

In accordance with the present invention, it has been found that single layers of very thin $Al_2O_3$ or $Y_2O_3$ in the range of 75 Å to 175 Å give extremely good barriers toward water vapor as set forth in Table 4 below.

TABLE 4

WATER VAPOR BARRIER DATA BOX COATER

| Design Thickness | | | Substrate | WVTR g/100 sq.in./day |
|---|---|---|---|---|
| Uncoated | | | 1 mil PET | 1.2–1.3 |
| Uncoated | | | 2 mil PET | .56–.63 |
| 100Å | $SnO_2$ | | 1 mil PET | 1.06 |
| 100Å | $SnO_2$ | | 2 mil PET | 0.56 |
| 100Å | $Y_2O_3$ | | 1 mil PET | 0.08 |
| 100Å | $Y_2O_3$ | | 2 mil PET | 0.086 |
| 100Å | $Al_2O_3$ | | 1 mil PET | 0.08 |
| 100Å | $Al_2O_3$ | | 2 mil PET | 0.091 |
| 100Å | MS65 | | 1 mil PET | 0.0461 |
| 100Å | MS65 | | 2 mil PET | 0.051 |
| 100Å | $SnO_2$/500Å | $SiO_2$ | 1 mil PET | 0.073 |
| 100Å | $SnO_2$/500Å | $SiO_2$ | 2 mil PET | 0.079 |
| 100Å | $Y_2O_3$/500Å | $SiO_2$ | 1 mil PET | 0.033 |
| 100Å | $Y_2O_3$/500Å | $SiO_2$ | 2 mil PET | 0.075 |
| 100Å | $Al_2O_3$/500Å | $SiO_2$ | 1 mil PET | 0.072 |
| 100Å | $Al_2O_3$/500Å | $SiO_2$ | 2 mil PET | 0.075 |
| 100Å | MS65/500Å | $SiO_2$ | 1 mil PET | 0.25 |
| 100Å | MS65/500Å | $SiO_2$ | 2 mil PET | 0.18 |
| 100Å | $Al_2O_3$/500Å | MS65 | 1 mil PET | 0.0375 |
| 100Å | $Al_2O_3$/500Å | MS65 | 2 mil PET | 0.05 |

Figure 5:
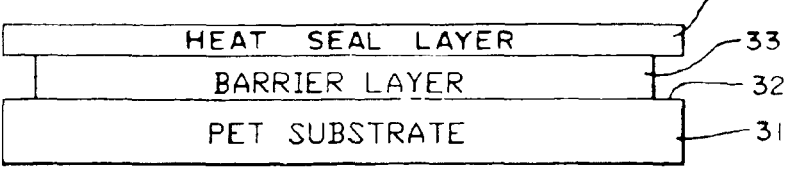
FIG. 5 is a cross sectional view of a barrier film in which the barrier is provided by a single layer.

It also has been found that even MS-65 produced by Flex Products, Inc., a mixture of 65% $SiO_2$/35% MgO, as described in U.S. Pat. No. 4,702,963, gives exceedingly low WVTR's. This was totally unexpected because published literature has indicated that 1000 Angstroms or greater in thickness of oxide coatings are necessary to achieve low WVTRs. Such a barrier film is shown in FIG. 5 in which a PET substrate 31 having a surface 32 is coated with a layer 33 of either yttrium oxide or aluminum oxide. A conventional heat seal layer 34 is provided. Alternatively, laminated polypropylene or polyethylene can be used for the heat seal layer 34.

It also has been found that low water vapor barrier properties can be achieved on roll coaters at speeds in excess of 100' per minute and still obtain results such as shown in Table 5 below. The roll coated barrier film appears to have a barrier property that is independent of thickness.

TABLE 5

WVTR's on ICI-393, 1 mil PET

| $Al_2O_3$ Thickness | WVTR g/100 sq.in./day |
|---|---|
| 75Å | 0.14 ± 0.03 |
| 100Å | 0.11 ± 0.02 |
| 150Å | 0.10 ± 0.01 |
| 200Å | 0.12 ± 0.03 |

The foregoing establishes that $Al_2O_3$, $SnO_2$ and $Y_2O_3$ can be utilized as a nucleation layer having a thickness ranging from approximately 50 to 100 Angstroms and in combination with silicon dioxide providing a substantial water vapor transmission reduction of approximately 20 fold. The thin nucleation layers above 50 Å and below 175 Å in thickness in combination with the silicon dioxide layer provides unexpected barrier properties. In the case of the $SnO_2$ nucleation layer, one needs to use an $SiO_2$ layer on top of it because the $SnO_2$ by itself does not confer any reduction in water vapor transmission rates (see Table 4). The silicon dioxide overlayer is also beneficial in bonding to the heat seal layer and for providing abrasion resistance to the thin nucleation layer.

Figure 9:
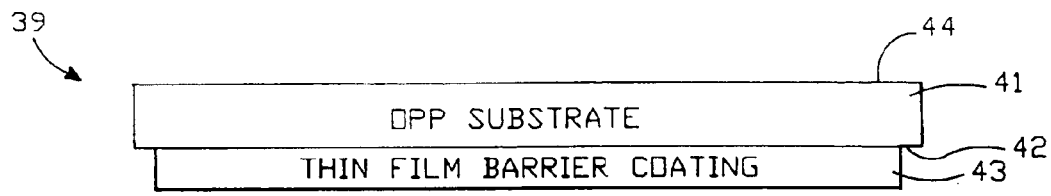
FIGS. 9 and 10 are cross-sectional views showing two pre-lamination constructions incorporating the present invention for a packaging film.
Figure 10:
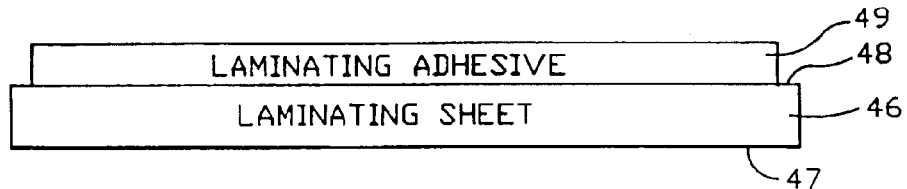

In FIG. 9 there is shown a cross-sectional view of a pre-lamination construction 39 to be used in a packaging film. It consists of a substrate 41 formed of a plastic which is capable of tearing in straight lines. A commercially available homo-polymer oriented polypropylene (OPP) film is utilized and has a thickness ranging from 55 gauge to 80 gauge. In the simplest embodiment, the substrate can be formed of a single layer of the homopolymer polypropylene. This is provided with a non-heat sealable characteristic in which only one surface is treated with a corona to provide an ionic discharge which raises the energy level of the surface of the film and permits organic coatings to wet that surface so that printing or graphics can be provided on that surface of the film.

In order to provide tearing along straight lines desired for this packaging film, the homopolymer polypropylene is bi-axially oriented (OPP) so that it has fairly uniform mechanical characteristics in both machine and transverse directions of the film. Other commercially available polypropylene products include a layer of homopolymer polypropylene which has co-extruded thereon a heat seal polymeric layer of a suitable thickness, such as 0.02 mils. A tri-layer design is also commercially available which has a layer of homopolymer polypropylene with both sides having formed thereon co-extruded layers of a heat seal polymeric layer of a suitable thickness, as for example, 0.02 mils. In either structure described above, one of the exterior surfaces can be provided with a corona surface treatment of the type hereinbefore described. Additional substrate types that are useful for this application include either polymeric films that have been coated with heat sealable layers on one or both surfaces after extrusion.

The substrate 41 shown in FIG. 9 can take the form of any of the various types of polypropylene films hereinbefore described. The barrier layer can be deposited on either side of the polypropylene but the preferred side is the one that has been corona treated. In the embodiments previously described, a nucleation layer has been provided followed by a silicon dioxide layer. In further work, it has been found that most of the barrier properties on PET were provided by the nucleation layer, except in the $SnO_2$ case rather than the $SiO_2$ layer. For that reason, the thickness of the nucleation layer was increased and the use of the silicon dioxide layer was discontinued. The nucleation layer was typically formed of a thickness ranging from 150 to 275 Angstroms depending upon the ultimate barrier properties desired.

Table 6 below shows some WVTR results for roll coated polypropylene with various barrier layers with and without lamination.

TABLE 6

EFFECTS OF LAMINATION[2] ON BARRIER COATED WEBS

| WEB ID | WEB TYPE | BARRIER TYPE | WVTR[1] |
|---|---|---|---|
| [1]313-3094 | 80 ga. OPP | MS65 | 0.087 |
| TM636-5 | 1313-3094/55 ga. OPP | MS65 | 0.073 |
| TM636-11 | 1313-3094/1313-3094 | MS65 | 0.026 |
| 1313-3092 | 80 ga. PET | $AL_2O_3$ | 0.098 |
| TM636-21 | 1313-3092/92 ga. PET | $AL_2O_3$ | 0.058 |
| TM636-27 | 1313-3092/1313-3092 | $AL_2O_3$ | 0.030 |

[1]WVTR IN GM/100 SQ IN/24 HR
[2]LAMINATIONS WERE MADE BY HAND
TM636-5 is a lamination of 1313-3094 and 55 ga. OPP.
TM636-11 is a lamination of 1313-3094 to itself.
TM363-21 is a lamination of 1313-3092 to 92 ga. PET
TM363-27 is a lamination of 1313-3092 to itself.

The above Table 6 shows that by laminating the two barrier coated webs into a composite a synergistic affect is realized. A three-fold improvement in water vapor transmission was realized where a two-fold improvement would ordinarily be expected.

In order to provide heat sealable capabilities for a packaging film, a laminating sheet 46 formed of a polypropylene can be of the type in which there is provided a co-extruded heat sealable surface on one side and a corona treated surface on the other side with the co-extruded side providing a surface 47 and the corona treated side providing a surface 48. The surface 48 is provided with a suitable laminating adhesive 49 to provide a laminating sheet construction 51. The two constructions 39 and 51 are bonded together in the manner shown in FIG. 11 in which the laminating adhesive 49 is brought into contact with a thin barrier coating 43 by the application of heat and pressure so that there is a packaging film 52 which is heat sealable on both sides by use of the surfaces 44 and 47. Typically, the laminating operation is carried out by applying the adhesive as a wet coating and then heating the same, driving out the carrier solvents so that there remains a viscous tacky adhesive. This adhesive is similar to a pressure sensitive adhesive which is adhered to the thin film which, with the application of heat and pressure, causes the laminating adhesive to be activated and to seal to the barrier coating and to bond the two substrates 46 and 41 together so they cannot be peeled apart easily.

Typically, the laminating sheet 46 would have a thickness of ½ mil to ¾ mil whereas the adhesive would have a thickness of approximately ¹/₁₀th of a mil. Typically, the substrate 41 can be formed of 70 gauge material whereas the laminating sheet 46 can be formed of 55 gauge material. It is possible to achieve a laminated construction such as that shown in FIG. 11 having a thickness of approximately 1.25 mils.

Figure 12:
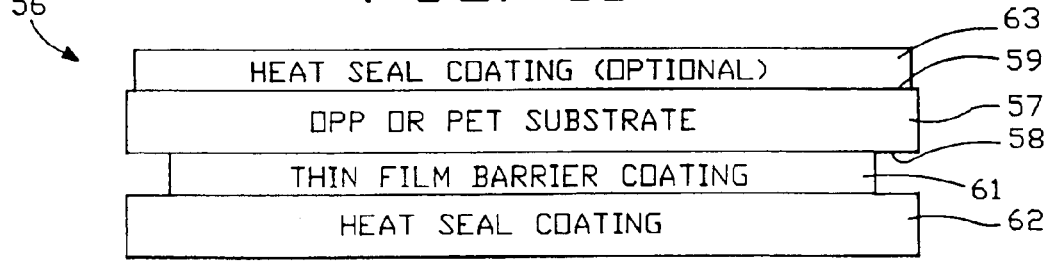
FIG. 12 is a cross-sectional view of a heat seal coated packaging film.

If it is desirable to have a thinner packaging film, an approach such as that shown in FIG. 12 can be utilized because at the present time polymeric substrates of thinner material that are heat sealable are not commercially available. The packaging film construction shown in FIG. 12 is comprised of a homopolymer polypropylene or PET substrate 57 having two surfaces 58 and 59. A barrier coating 61 is applied to the surface 58 in the manner hereinbefore described to a suitable thickness, as for example, 150 Angstroms utilizing aluminum oxide. A heat seal coating 62 is provided on the barrier film 61 to provide a heat seal coating which can be utilized on one side of the packaging film. Depending upon the material utilized for the substrate 57, if needed, a heat seal coating 63 can be provided on the other side 59. Utilizing such a construction it is possible to achieve a packaging film having an overall thickness of less than 0.9 mil with the 70 gauge substrate 57 having a thickness of 0.70 mil and with each of the heat seal coatings 62 and 63 having a thickness of 0.1 mil.

Figure 11:
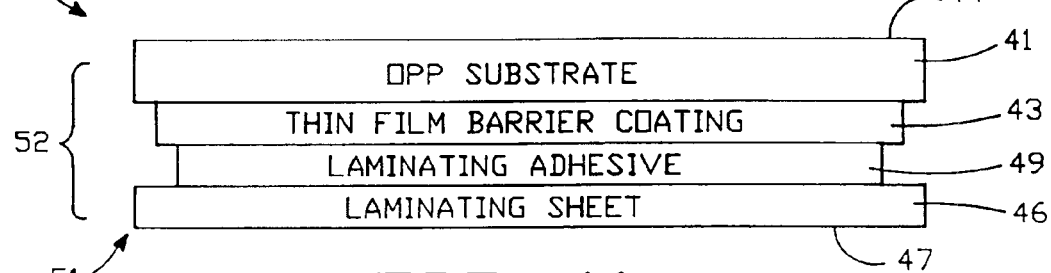
FIG. 11 is a cross-sectional view showing the packaging film post-lamination.

In applications where the packaging film is subjected to heat and tension, it is preferable to utilize the construction shown in FIG. 11 in which the laminating sheet 46 is provided to accommodate the heating and tensioning which may take place. This ensures that the thin film barrier coating will not be deleteriously affected by the heating and tensioning of a heat seal coating. In the construction shown in FIG. 11, the packaging film can be provided without excessive heat or tensioning merely by introducing the two substrates 39 and 51 into a laminating nip after the laminated adhesive has been applied without subjecting the barrier coating 43 to excessive heat. The only disadvantage is that there is an increased cost for the additional laminating sheet 46 and the additional thickness which may make it necessary to run packaging machinery utilizing the packaging material to run at a lower speed because of the increased heat required for heat sealing because of the thicker packaging material.

Figure 13:
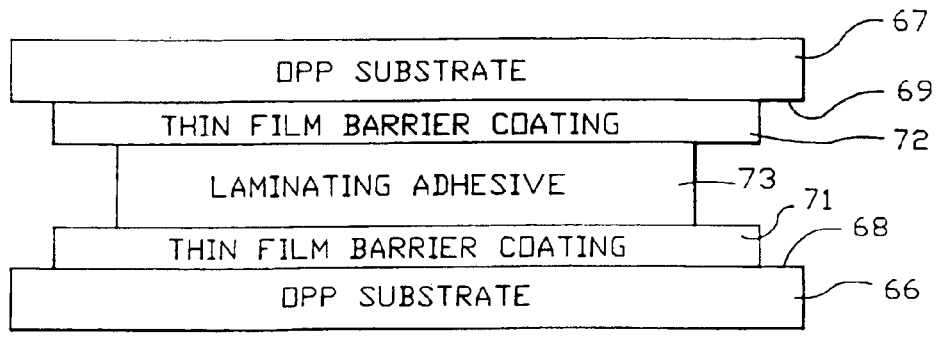
FIG. 13 is a cross-sectional view of a barrier-type film construction which is heat sealable onto itself and on which the two layers of a barrier coating are provided facing each other.

In FIG. 13 there is shown another construction of a barrier-type packaging film 64 which is comprised of biaxially oriented coextruded polypropylene substrates 66 and 67 having surfaces 68 and 69 respectively upon which there is provided barrier coating 71 and 72 of a suitable thickness ranging from 50 to 180 Angstroms formed of a suitable material such as aluminum oxide. The two substrates 66 and 67 are laminated together by applying a laminating adhesive 73 between the facing barrier films 71 and 72 so that the barrier films are face to face in the center of the laminated construction. Such a barrier type packaging film has at least two advantages. By placing the two barrier coatings 71 and 72 facing each other any cracks or holes appearing in one of the barrier coatings would be covered by the other barrier coating to thus, in effect, provide double protection. By providing the biaxially coextruded polypropylene substrates 66 and 67 on opposite sides, the barrier-type packaging film 66 can be heat sealed onto itself.

Figure 14:
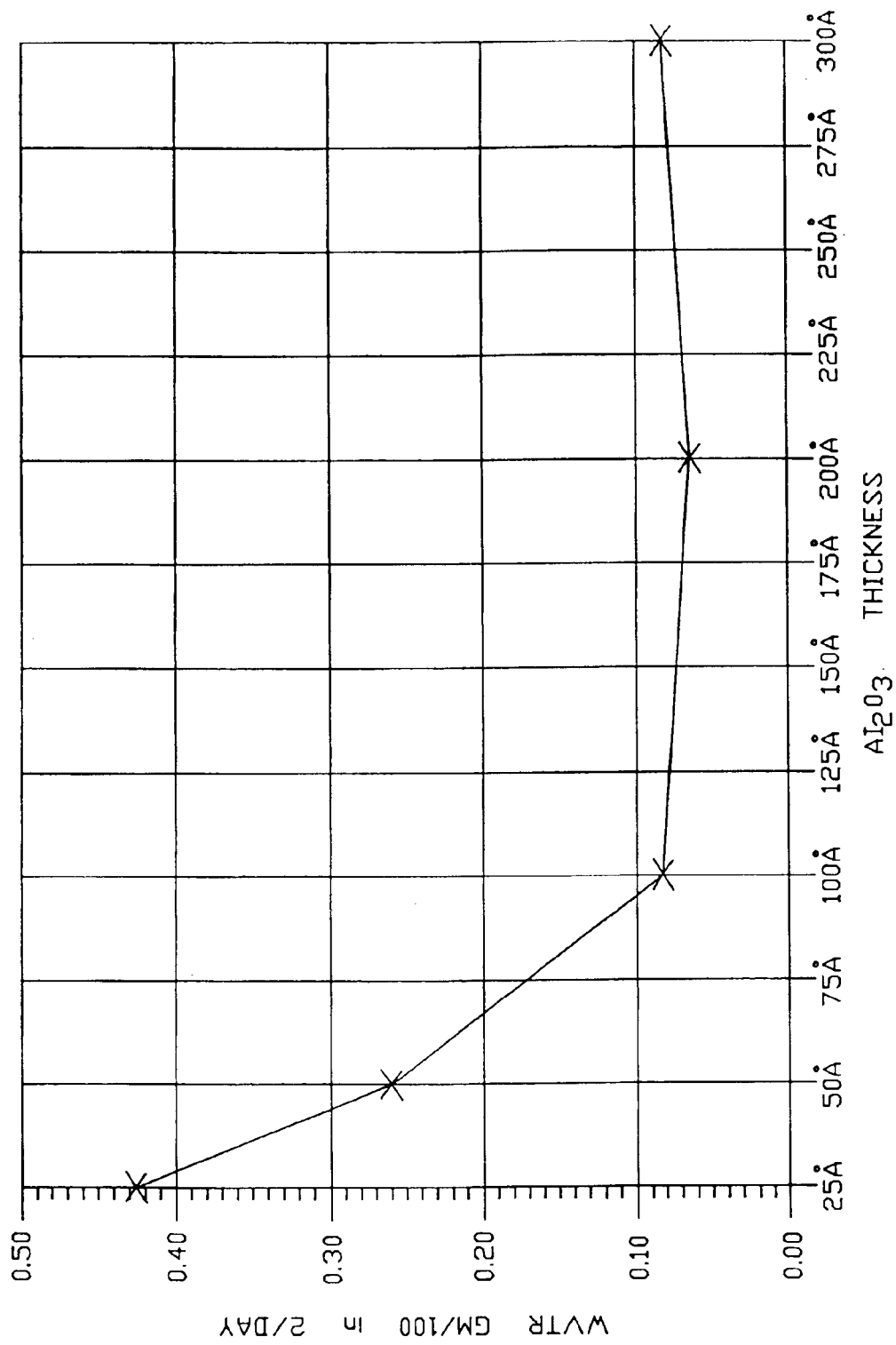
FIG. 14 is a graph showing water vapor transmission rates for single layer aluminum oxide ($AL_2O_3$) on 70 gauge polypropylene.

In FIG. 14, a graph is shown in which the water vapor transmission data for a single layer of aluminum oxide on 70 gauge polypropylene ranging in thickness from 25 to 300 Angstroms. The graph shows that the water vapor transmission decreases substantially from 25 Angstroms to 100 Angstroms and then it approximately the same for greater thicknesses of aluminum oxide.

In comparing the graph shown in FIG. 14 with the graphs shown in FIGS. 6, 7 and 8, it can be seen that a greater thickness of aluminum oxide is required to achieve the same water vapor transmission rates. The polypropylene requires a greater thickness of barrier coating than does the polyester.

From the foregoing, it can be seen that when a barrier coated substrate is laminated to a heat sealable substrate and when a heat seal coating is applied directly to a barrier film, a packaging film is created which can be used as an overwrap to retard the moisture vapor and gas migration to or from foods, pharmaceutical devices, tobacco products and other industrial products.

As hereinbefore disclosed for polyester based barrier films, a heat seal coating is required to provide a sealing surface. Heat seal coatings may be applied to either/or both sides of the barrier coated film depending on the particular finished product seal or laminating requirements. For lap-type seals, the heat seal coating would normally be applied to both sides of the barrier coated film. For fin-type sealing or lamination, the heat seal coating would normally be applied to the barrier coated side only. For certain special applications, the heat seal coating can be applied to the non-barrier coated side of the film.

For polypropylene films, a heat seal coating may or may not be required for both surfaces of the film depending upon the polypropylene chosen and on the particular application.

For the heat seal layers, conventional heat seal coating resin systems can be utilized which can include polyester urethane, ethylene interpolymers (EVA, EAA type polymers) and acrylic based formulas. Both water reduced and solvent reduced coatings can be used depending upon the type of substrate chosen and the surface treatment of the substrate. In general it has been found that water based heat seal coatings require a corona treated surface to obtain good adhesion of the coating to the substrate. These heat seal coatings can be modified with slip agents to improve their machinability.

From the foregoing it can be seen that there has been provided a barrier film which is highly transparent in the visible region which serves as a barrier to water vapor and oxygen. Polymeric film substrates can be used. The use of the vacuum deposited inorganic oxide such as the silicon dioxide makes it possible to replace existing aluminized polyester and co-extruded polymeric films. Because of the capabilities of utilizing thinner substrates, the total volume of plastic utilized is greatly reduced. The use of the silicon dioxide or aluminum oxide coating will also reduce the difficulty in recycling plastic because in recycling processes, the thin oxide film will simply act as a trace component and can be worked into the new polymer as a filler. Since the use of a metal layer has been eliminated by the use of inorganic oxides, the barrier film can be utilized for food packaging which can be heated in microwave units. The film of the present invention permits simpler packaging while permitting the customers to view the contents before use and still provide a long shelf life. By utilizing the barrier coating in the present barrier film, the use of PVC and PVDC as barrier materials is eliminated overcoming the possibility of unreacted monomers reaching food contents in the package. The barrier film in the present invention is also advantageous in medical packaging because it permits viewing of the contents of the bag without opening of the same.

The barrier film is also particularly desirable for use in packaging materials where a predetermined moisture content must be maintained in the product. Tobacco is an example of such a product in which it is desired to provide a predetermined moisture content. If excessive moisture is present, the product will mold. If insufficient moisture is present, the product tastes stale. The barrier film of the present invention makes it possible to package tobacco products in a clear film and at the same time to provide a high shelf life in all kinds of climates including those that have high humidity as present in the tropics and those that have low humidities as in desert climates. By utilizing biaxially oriented polypropylene it is possible to provide barrier films which will tear in straight lines making them particularly desirable for use in packaging certain products as, for example, cigarettes.

By providing the barrier film with layers of heat sealing material, the material can be heat sealed onto itself to provide simplified packaging. By providing a heat sealing layer on both sides, the material can be folded either way to heat seal on itself. Also, in certain types of packaging, it is an advantage to provide heat sealing capabilities of both sides on the barrier film.

It should be appreciated that the nucleation layer and barrier layer combinations can be deposited by other methods of vacuum deposition including C.V.D. plasma-type sputtering processes, ion assisted processed such as ion plating, as for example, meta-mode (TM), as well as others well known to those skilled in the art of vacuum deposition.

In connection with the embodiments of the barrier film incorporating the present invention hereinbefore described, difficulties have been encountered and utilized in the same connection with cigarette packaging lines because the typical 130 gauge film produced could only be used on selected packaging lines. In order to produce a barrier film for packaging of reduced thickness, as for example 90 to 80 gauge so that it can be utilized in conventional cigarette packaging machines, the monolithic barrier film 81 shown in FIG. 15 has been provided. As shown therein it consists of a base film or substrate 82 which is provided with first and second surfaces 83 and 84 disposed on opposite sides thereof. The base film 82 can have a suitable thickness ranging from, for example 50 gauge to 70 gauge. It has been found that the base film or substrate 82 can be formed of a polyester or alternatively polypropylene (OPP). One polyester found to be satisfactory was the Hoechst 2CXI that was made without its normal surface treatment. This substrate has been given a tentative identification number of EH-1913. Another polyester found to be satisfactory was identified as PT4000 supplied by Hoechst which was selected because its smooth surface properties. A satisfactory polypropylene product was found to be supplied by Hercules and identified as BK-522 which can be characterized as a composite of polypropylene and Surlyn. It is desirable that the material is utilized for the base film or substrate 82 have good friction characteristics, as for example the coefficient of friction should preferably be approximately 0.5 or less to facilitate the running of the barrier films on packaging machines. A barrier layer or coating 86 is formed on the surface 83 and a heat seal layer 87 is formed on the opposite surface 87. The barrier coating 86 is formed of materials hereinbefore described in connection with the previous embodiments, as for example aluminum oxide. Typically the surface 83 in which the barrier coating 86 is deposited is untreated. The heat seal layer 87 is supplied by Hoechst as a part of its 2CXI product and typically can be formed of a suitable material such as a lower melting point polyester and had a thickness ranging from 10 gauge to 30 gauge with the polyester base film or substrate 82 having a thickness ranging from 40 to 70 gauge. When the base film or substrate was a composite such as polypropylene and Surlyn, the heat seal 87 was in the form of a Surlyn heat seal material supplied by Hercules as a part of its BK-522 product. To prevent blocking (i.e. sticking) of the barrier film, the Surlyn layer was modified using a Surlyn with a higher tack temperature. This OPP/Surlyn substrate is identified as BK-522XQ79. The heat seal layer is formed of polar materials to facilitate the formation of bonds to high surface energy surfaces, such as oxides, to itself, or to polar polymeric films.

Figure 16:
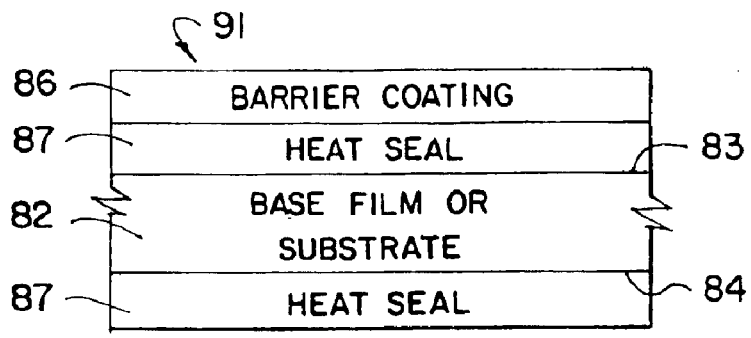
FIG. 16 is a cross-sectional view of a monolithic barrier film incorporating the present invention.

In accordance with the present invention it has been found that the barrier coating of the present invention can be satisfactorily applied over a heat seal as shown in FIG. 16. Barrier film 91 has a heat seal 87 of the type hereinbefore described formed on both of the surfaces 83 and 84 and then has the barrier coating 86 formed on the surface of the heat seal 87.

Figure 15:
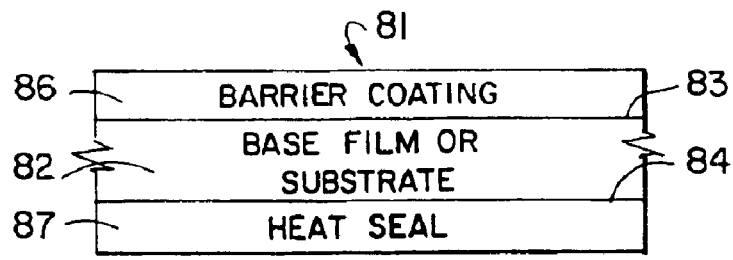
FIG. 15 is a cross-sectional view of another embodiment of a barrier film incorporating the present invention which is in the form of a monolithic product.
Figure 17:
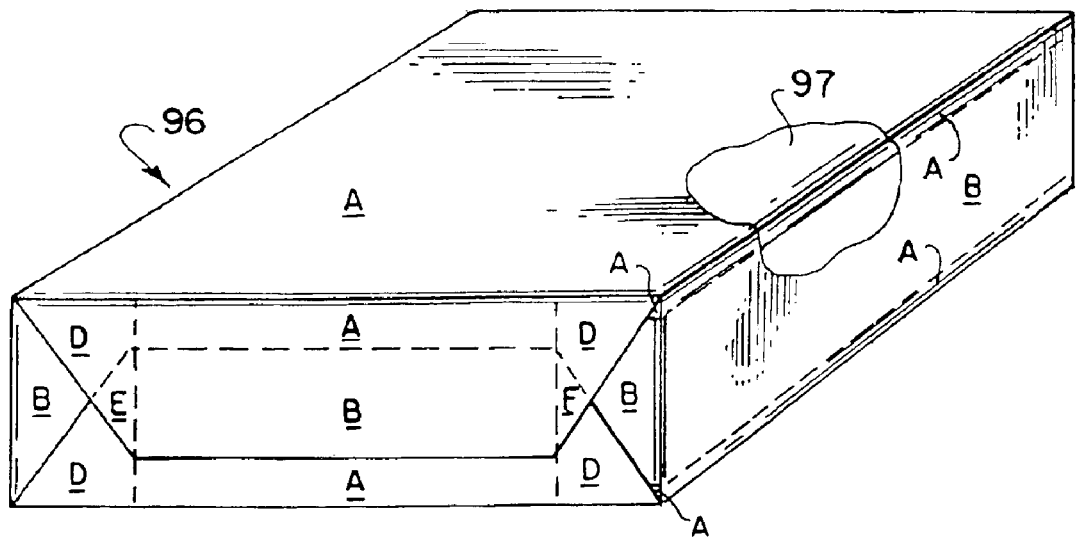
FIG. 17 is an isometric view of a cigarette package wrapped in a barrier film of the present invention shown in FIG. 15 and FIG. 16 and showing the manner in which it overlaps to form good heat seals.

In connection with utilizing the barrier film shown in FIGS. 15 and 16, as for example the packaging of cigarettes, it is important that the barrier layer faces the package so that it will not be abraded or damaged during handling or by being exposed directly to the elements. To accomplish this, it is desirable that the barrier layer face the package or carton while at the same time to make it possible to obtain total sealability of the package to be sure that it is air-tight. Such a packaging arrangement is shown in FIG. 17. The package 96 shown in FIG. 17 is in the form of a parallelepiped representing a conventional cigarette package configuration in which the barrier film is wrapped about the inner package 97 and sealed to provide air-tight heat seals between the film overlaps. The inner package 97 can be formed of a conventional material such as cardboard or paper which typically is susceptible to oxygen and water vapor penetration. The manner in which this is accomplished is shown in FIG. 17 wherein the overlap areas have been designated with the letters A, B, C, D, E and F. The manner in which the barrier coating faces in toward the package and in which the heat seals are made between the overlaps is shown in the diagrams set forth below.

---

OVERLAP A

Heat Seal
Base Film
Barrier Coating
PACKAGE
OVERLAP B

Heat Seal
Base Film
Barrier Coating
Heat Seal
Base Film
Barrier Coating
PACKAGE
OVERLAP C Heat Seal
Base Film
Barrier Coating
Barrier Coating
Base Film
Heat Seal
Heat Seal
Base Film
Barrier Coating
PACKAGE
OVERLAP D Heat Seal
Base Film
Barrier Coating
Barrier Coating
Base Film
Heat Seal
Heat Seal
Base Film
Barrier Coating
Heat Seal
Base Film
Barrier Coating
PACKAGE
OVERLAP E Heat Seal
Base Film
Barrier Coating
Barrier Coating
Base Film
Heat Seal
Heat Seal
Base Film
Barrier Coating
Barrier Coating
Base Film
Heat Seal
Heat Seal
Base Film
Barrier Coating
PACKAGE
OVERLAP F Heat Seal
Base Film
Barrier Coating
Barrier Coating
Base Film
Heat Seal
Heat Seal
Base Film
Barrier Coating
Barrier Coating
Base Film
Heat Seal
Heat Seal
Base Film
Barrier Coating
Heat Seal
Base Film
Barrier Coating
PACKAGE

---

It can be seen from above that the barrier coating always faces inwardly of the package and that the heat seals are formed between a heat seal layer and a barrier layer or coating. Thus, with the barrier films 81 and 91 shown in FIGS. 15 and 16 it is possible to provide packages with a barrier film having the barrier coating facing inwardly of the package so that it is not subject to abrasion and damage and therefore remains intact.

It has been found that the barrier films 81 and 91 shown in FIGS. 15 and 16 have very desirable properties. The barrier films have a thickness which is approximately 80 gauge or less so that it can be readily run on conventional cigarette packaging machinery. The coefficient of friction is low, approximately 0.5 or less. The water vapor transmission rate (WVTR) range is from 0.06–0.12 grams per 100 square inches per day and the oxygen transmission rate range is from 0.9 to 50 cubic centimeters per 100 square inches per day. Specific examples of these transmission rates for uncoated and coated materials are set forth below.

|  | $O_2$ TR (cc/100 in²/day) | |
|---|---|---|
|  | uncoated | coated |
| Hercules BK-522 (OPP/Surlyn) | 193 | 49.17 |
| Hoechst EH-1913 | 4.78 | 0.918 |

|  | WVTR (gms/100 in²/day) | |
|---|---|---|
|  | uncoated | coated |
| Hercules BK-522 (OPP/Surlyn) | 0.6620 | 0.1028 |
| Hoechst 2CX1 PET | 2.0600 | 0.0661 |

From the foregoing it can be seen that excellent water vapor and oxygen transmission rates can be achieved with a monolithic barrier film of reduced thickness permitting it to be used on conventional packaging machinery.

It should be appreciated that although considerable emphasis has been placed on the packaging of cigarettes with the barrier films of the present invention, the barrier films have many other applications in the food and medical industries, as for example in the food where flavor retention is necessary.

What is claimed is:

1. In a packaged article, an inner package formed of a packaging material which is susceptible to oxygen and water vapor penetration, a packaging film wrapped about and enclosing said inner package, said outer packaging film having low water vapor and oxygen transmission rates, said packaging film being monolithic and being comprised of a single layer of flexible plastic material serving as a substrate and having first and second surfaces, a barrier coating selected from the group consisting of aluminum oxide, yttrium oxide and mixed alloy consisting of 65% silica and 35% magnesia having a thickness between 50 and less than 200 Angstroms, wherein the barrier coating is carried by the first surface and, a heat seal layer carried by at least portions of the second surface, said packaging film being wrapped onto the inner package so that the barrier coating faces the inner package, at least a portion of the heat seal layer facing another portion of the outer packaging film so that said portions overlap and are in contact and bonded with each other to form an overlap so that the packaging film provides an air-tight enclosure for the inner package.

2. An article as in claim 1 wherein said heat seal layer is formed of a polar material.

3. An article as in claim 2 wherein said packaging film has a coefficient of friction of approximately 0.01 to 0.5.

4. An article as in claim 1 wherein said overlap is formed so that the barrier coating in the overlaps faces the inner package.

5. In a packaged article, an inner package formed of a packaging material which is susceptible to oxygen and water vapor penetration, a packaging film wrapped about and enclosing said inner package, said outer packaging film having low water vapor and oxygen transmission rates, said packaging film being comprised of a flexible plastic material serving as a substrate and having first and second surfaces, an barrier costing selected from the group consisting of aluminum oxide, yttrium oxide and mixed alloy consisting of 65% silica and 35% magnesia having a thickness between 50 and less than 200 Angstroms, carried by the first surface, a laminating adhesive carried by the barrier coating and a laminating sheet carried by the laminating adhesive, wherein the second surface of the substrate and the outer surface of the laminating sheet are heat sealable so that the two heat seal surfaces are bonded in portions of the packing film so that the packaging film provides an air-tight enclosure for the inner package.

6. An article as in claim 5 wherein said outer packaging film has a thickness ranging from 125–155 gauge.

7. An article as in claim 5 wherein said heat seal layer is formed of a polar material.

8. An article as in claim 5 wherein said packaging film ha a coefficient of friction of approximately 0.01 to 0.5.

9. In a packaged article as defined in claim 5, wherein the barrier coating is a layer of $Al_2O_3$.

* * * * *

UNITED STATES PATENT AND TRADEMARK OFFICE
CERTIFICATE OF CORRECTION

PATENT NO. : 6,913,808 B2 Page 1 of 1
APPLICATION NO. : 10/457918
DATED : July 5, 2005
INVENTOR(S) : Phillips et al.

It is certified that error appears in the above-identified patent and that said Letters Patent is hereby corrected as shown below:

Col. 16, line 11, "costing"" should read -- coating --.

Signed and Sealed this

Fourth Day of July, 2006

JON W. DUDAS
*Director of the United States Patent and Trademark Office*